(12) United States Patent
Kwon

(10) Patent No.: US 6,809,309 B2
(45) Date of Patent: Oct. 26, 2004

(54) CMOS IMAGE SENSOR

(75) Inventor: Oh Bong Kwon, Kyonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 34 days.

(21) Appl. No.: 10/197,491

(22) Filed: Jul. 18, 2002

(65) Prior Publication Data

US 2003/0015738 A1 Jan. 23, 2003

(30) Foreign Application Priority Data

Jul. 18, 2001 (KR) .................................... P2001-43140

(51) Int. Cl.[7] .............................................. H01L 31/00
(52) U.S. Cl. .............................. 250/214.1; 250/208.1; 257/292; 348/302
(58) Field of Search .......................... 250/208.1, 214.1, 250/214 R; 257/292; 348/302–303, 307–308, 310

(56) References Cited

U.S. PATENT DOCUMENTS

| 5,426,292 A | * | 6/1995 | Bird et al. ................ 250/208.1 |
| 6,512,544 B1 | * | 1/2003 | Merrill et al. .............. 348/302 |
| 6,741,283 B1 | * | 5/2004 | Merrill et al. .............. 348/308 |

* cited by examiner

Primary Examiner—Stephone B. Allen
Assistant Examiner—Patrick J. Lee
(74) Attorney, Agent, or Firm—Birch, Stewart, Kolasch & Birch, LLP

(57) ABSTRACT

A CMOS image sensor is disclosed in which a charge storage gate is formed at one side of a photodiode region to increase charge capacity for each cell, thereby improving characteristics of a device. The CMOS image sensor includes a photodiode region generating image signal charges by converting image signals of light to electrical signals, and a charge storage gate formed near the photodiode region, wherein the charges of the photodiode region are partially or entirely transferred to a portion below the charge storage gate when the charges are generated, and the charges stored, when the charges are read out, are transferred to a read out node.

6 Claims, 9 Drawing Sheets

CMOS IMAGE SENSOR

This application claims the benefit of the Korean Application No. P2001-43140 filed on Jul. 18, 2001, which is hereby incorporated by reference.

BACKGROUND OF THE INVENTION

1. Field of the Invention

The present invention relates to an image sensor, and more particularly, to a complementary metal oxide semiconductor (CMOS) image sensor in which a charge storage gate is formed at one side of a photodiode region to increase charge capacity for each cell, thereby improving characteristics of a device.

2. Discussion of the Related Art

Most of charge-coupled devices (CCDs) developed and used as an image pickup device are driven using a higher voltage of +15V~−9V than a voltage of CMOS circuits. Since the process of manufacturing a CCD is similar to the process of manufacturing a bipolar transistor, the process cost of a CCD is higher than that of a CMOS. To solve such a problem, there has been provided a CMOS image sensor that can integrate an image sensor and peripheral chips having various functions into one chip and enables low voltage operation, low power consumption, and cheaper process cost. Also, the CMOS image sensor has the advantage in that it can be used for the process of manufacturing a CMOS transistor that enables the ultra-fine process. However, in spite of such advantages, the CMOS image sensor has a problem in picture quality. A newly suggested CMOS image sensor of a photo gate structure still has a limitation in improving picture quality due to the difference in charge efficiency between wavelength bands.

In the above respects, research and development of a CMOS image sensor of a new pixel structure is required.

A related art CMOS image sensor will now be described with reference to the accompanying drawings.

FIG. 1 is a circuit diagram of a pixel of a related art CMOS image sensor, and FIG. 2 is a sectional view of a pixel of the related art CMOS image sensor.

The CMOS image sensor of FIG. 1 has a 4-TR structure. Referring to FIG. 1, the CMOS image sensor includes a reset transistor 1 having a gate to which a reset signal RX is applied, one electrode connected with a floating node 2, and the other electrode connected to a VDD terminal, a source-follower transistor 3 having a gate connected with the floating node 2 and one electrode connected with the VDD terminal, a select transistor 4 having a gate to which a row select signal is input and one electrode serially connected to the source-follower transistor 3 to connect to an output terminal Vout, a transfer transistor 5 having one electrode connected with the floating node 2 and a gate to which a transfer signal TX is input to transfer storage charge when reading the storage charge, and a photodiode 6 provided between the transfer transistor 5 and a ground terminal.

In addition to the aforementioned image sensor of a 4-TR structure, examples of a CMOS image sensor include a 3-TR structure and a 1-TR structure. The 3-TR structure has no transfer transistor and the 1-TR structure has only a select transistor.

The sectional structure of the related art CMOS image sensor will be described with reference to FIG. 2.

As shown in FIG. 2, a p type epitaxial layer 22 is formed on a p type semiconductor substrate 21.

An n type photodiode region 23 and a p type photodiode surface region 24 are formed within a surface of the p type epitaxial layer 22. Only the n type photodiode region 23 may be formed as the case may be.

An n+ type region 27 used as a floating diffusion region for sensing image charges is formed in the p type epitaxial layer 22 and spaced apart from the photodiode regions 23 and 24.

A transfer gate 25 is formed over the p type epitaxial layer 22 between the photodiode regions 23 and 24 and the n+ type region 27.

A reset gate 26 is formed on the p type epitaxial layer 22 at one side of the n+ type region 27.

The charge sensing operation of the aforementioned related art CMOS image sensor will be described with reference to FIGS. 3A to 3D.

FIGS. 3A to 3D illustrate the operation of generating and reading out charges of the related art CMOS image sensor.

As shown in FIG. 3A, signal charges are stored in a photodiode by an external incident light.

As shown in FIG. 3B, a read out node (floating node) is reset, and then, as shown in FIG. 3C, signal levels of the stored charges are transferred to the floating gate if a transfer signal $V_{TX}$ is input to a gate of a transfer transistor to turn on the transfer transistor.

In this state, as shown in FIG. 3D, the reset transistor is turned off and the potential of the floating node, which is a source terminal of the reset transistor, is varied by the stored signal charges. For this reason, the gate potential of the source-follower transistor is varied.

The variation of the gate potential of the source-follower transistor varies a bias of a source terminal of the source-follower transistor or drain node of the select transistor.

Once the low select signal $V_{ROW}$ is input to the gate of the select transistor before the read out node (floating node) is reset, the select transistor outputs the potential difference between the reference potential of the reset read out node (floating node) and the signal charges generated in the photodiode to the output terminal.

The reset transistor is turned on by the reset signal after detecting signal levels by generating charges of the photodiode. Therefore, the signal charges are all reset.

The above operation is repeated so that the reference potential and the signal levels are read out.

However, the related art CMOS image sensor has several problems.

The charge capacity of the photodiode is determined by the area of the photodiode, the doping concentration of the n type photodiode, the impurity concentration of the substrate, and the doping concentration of the p type photodiode surface. The charge capacity of the photodiode is an important factor that influences characteristics of optical signals. The area of the photodiode is reduced as the pixel size is reduced to enhance resolution in the same chip area and to obtain price competition.

Under the circumstances, there is a limitation in obtaining the charge capacity by controlling the impurity density.

SUMMARY OF THE INVENTION

Accordingly, the present invention is directed to a CMOS image sensor that substantially obviates one or more problems due to limitations and disadvantages of the related art.

An object of the present invention is to provide a CMOS image sensor in which a charge storage gate is formed at one side of a photodiode region to increase charge capacity for each cell, thereby improving characteristics of a device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a CMOS image sensor includes a photodiode region generating image signal charges by converting image signals of light to electrical signals, and a charge storage gate formed near the photodiode region, wherein the charges of the photodiode region are partially or entirely transferred to a portion below the charge storage gate when the charges are generated, and the charges stored when the charges are read out are transferred to a read out node.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
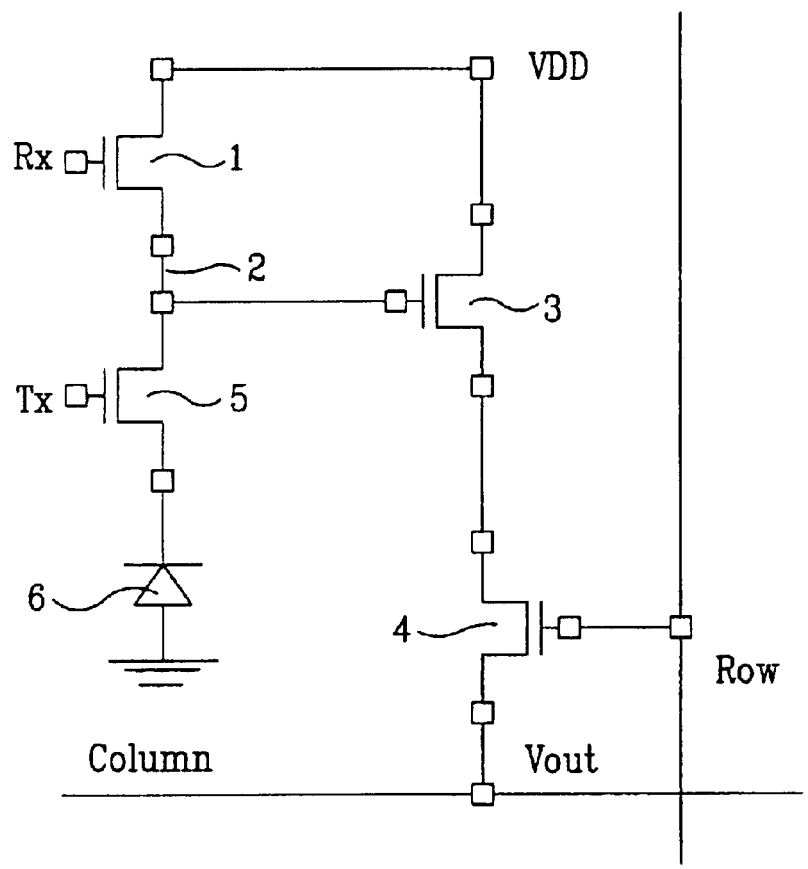
FIG. 1 is a circuit diagram of a pixel of a related art CMOS image sensor.
Figure 2:
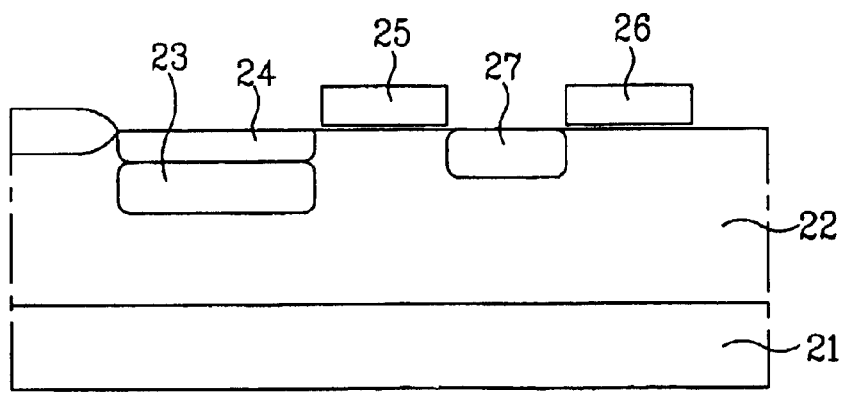
FIG. 2 is a sectional view of a pixel of a related art CMOS image sensor.
Figure 3A:
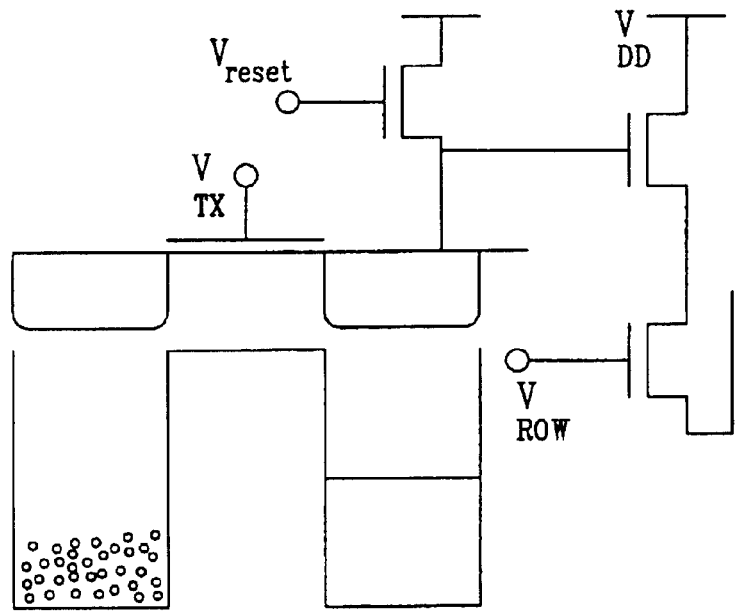
FIGS. 3A to 3D illustrate the operation of generating and reading out charges of a related art CMOS image sensor.
Figure 3B:
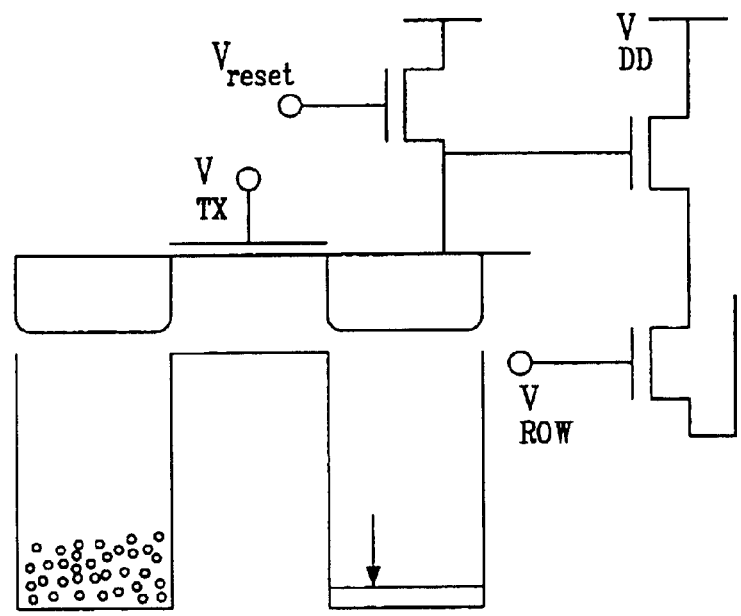
Figure 3C:
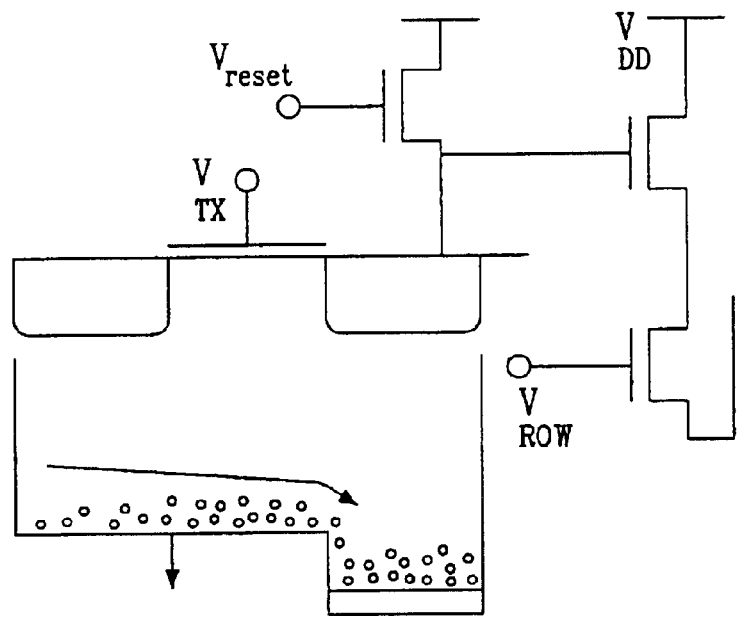
Figure 3D:
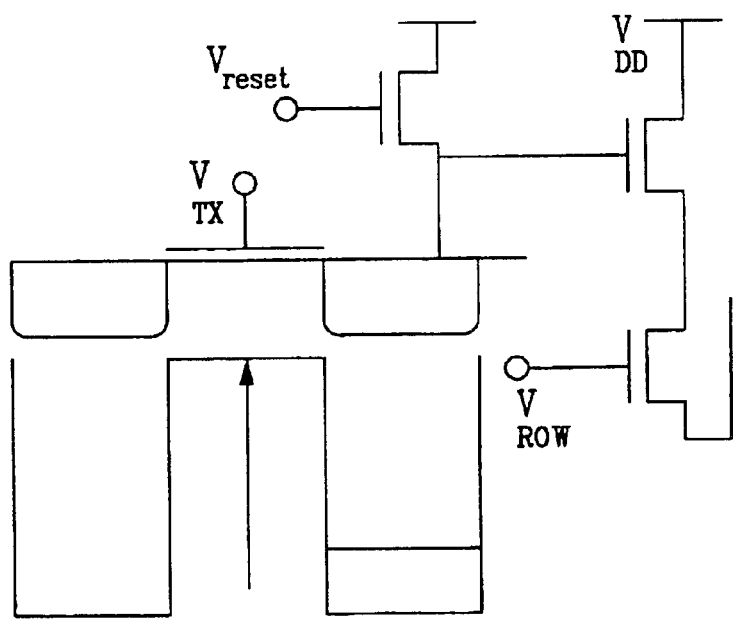
Figure 4A:
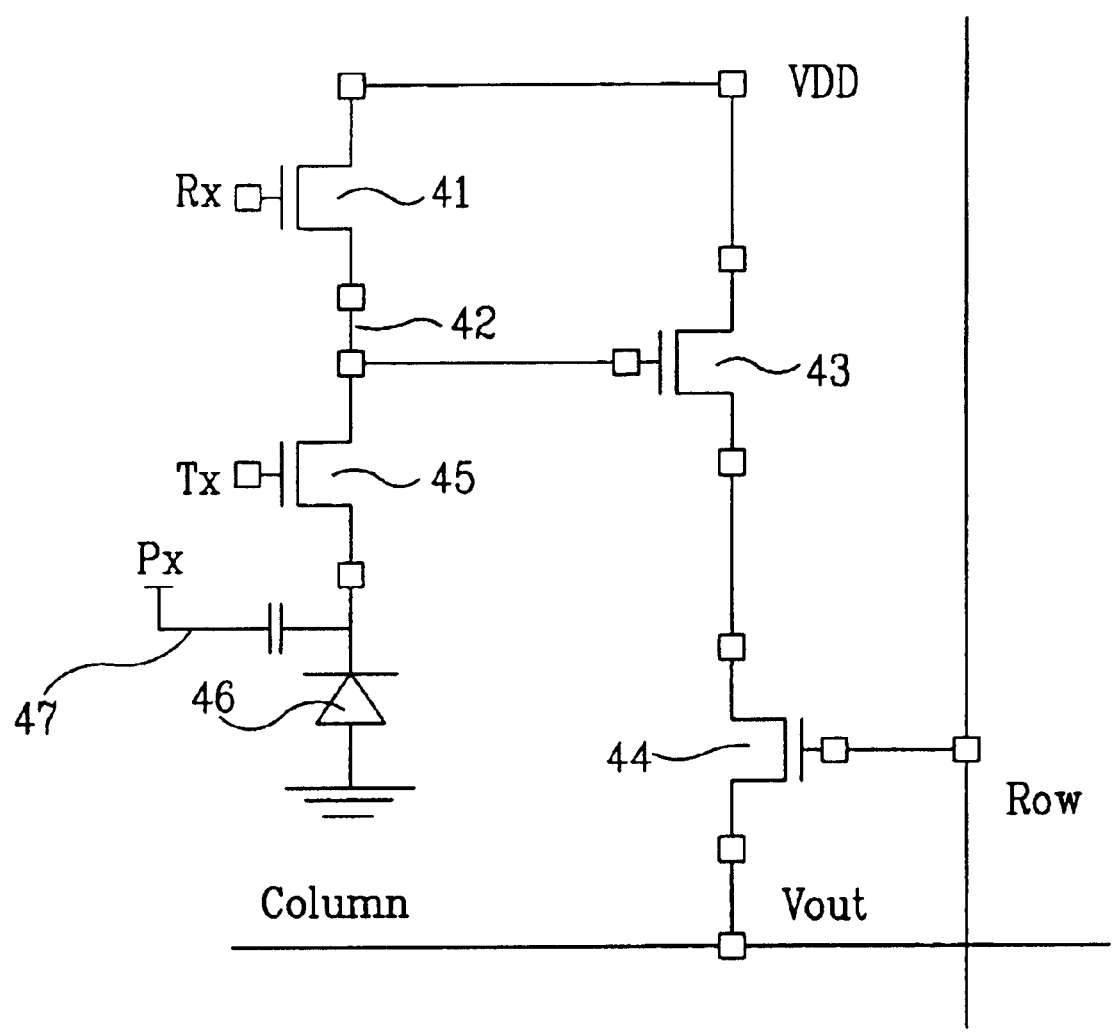
FIG. 4A is a circuit diagram of a pixel of a CMOS image sensor having a 4-TR structure according to the present invention.
Figure 4B:
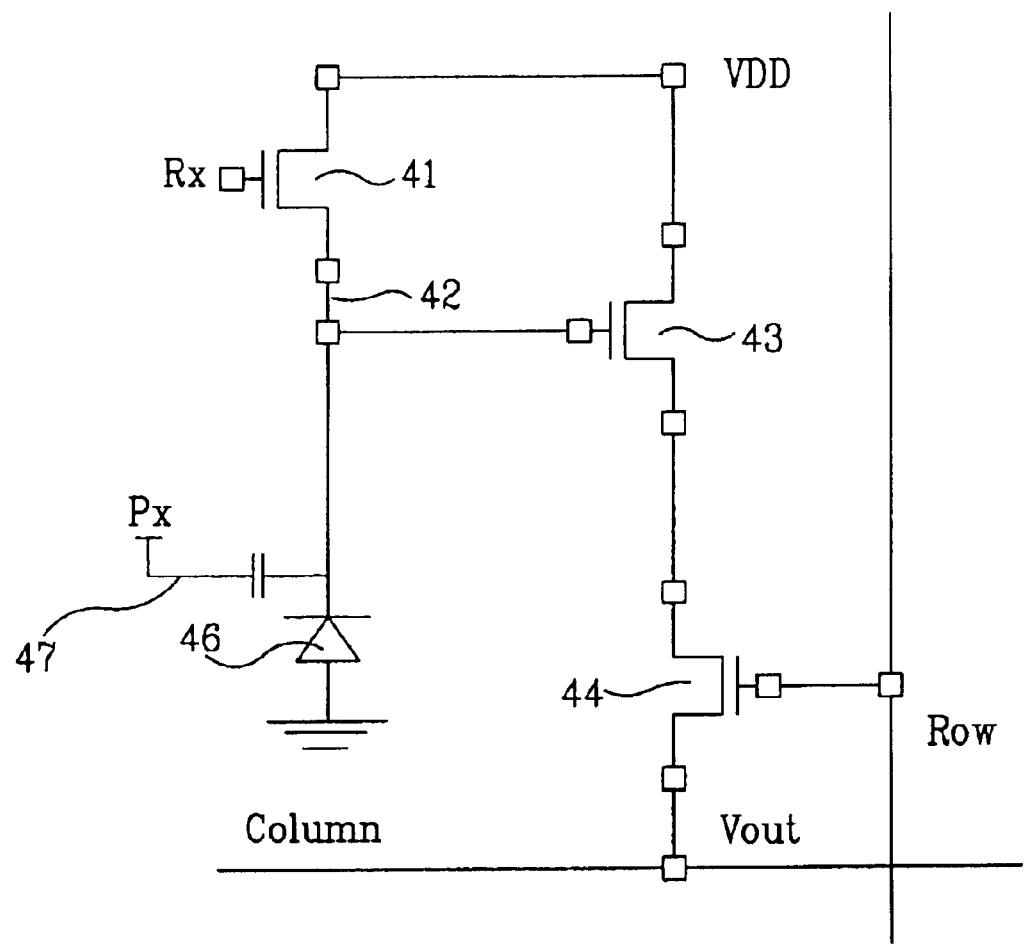
FIG. 4B is a circuit diagram of a pixel of a CMOS image sensor having a 3-TR structure according to the present invention.

FIG. 4A is a circuit diagram of a pixel of a CMOS image sensor having a 4-TR structure according to the present invention, and FIG. 4B is a circuit diagram of a pixel of a CMOS image sensor having a 3-TR structure according to the present invention.

Referring to FIG. 4A, the CMOS image sensor according to the present invention includes a reset transistor 41 having a gate to which a reset signal RX is applied, one electrode connected to a floating node 42, and the other electrode connected to a VDD terminal, a source-follower transistor 43 having a gate connected to the floating node 42 and one electrode connected with the VDD terminal, a select transistor 44 having a gate to which a column select signal is input and one electrode serially connected to the source-follower transistor 43 to connect to an output terminal Vout, and a transfer transistor 45 having one electrode connected to the floating node 42 and a gate to which a transfer signal TX is input so as to transfer storage charges when reading out the storage charge. The CMOS image sensor further includes a photodiode 46 provided between the transfer transistor 45 and a ground terminal, and a charge storage gate 47 formed at one side of the photodiode 46, having a gate to which a charge storage/discharge signal PX is applied. The charge storage gate 47 stores the generated charges in the lower side of the gate when a voltage having a polarity opposite to that of the generated charges is applied while transfers the stored charges to the transfer gate 45 when a voltage having the same polarity as that of the generated charges or a ground voltage is applied.

It is to be understood that the charge storage gate 47 of the present invention can be used for a CMOS image sensor having a 3-TR structure with no transfer transistor and a 1-TR structure with only a select transistor in addition to the aforementioned CMOS image sensor having a 4-TR structure.

The charge storage gate of the present invention will be used for the CMOS image sensor having a 3-TR structure as follows.

As shown in FIG. 4B, the CMOS image sensor having a 3-TR structure includes a reset transistor 41 having a gate to which a reset signal RX is applied, one electrode connected to a floating node 42, and the other electrode connected to a VDD terminal, a source-follower transistor 43 having a gate connected to the floating node 42 and one electrode connected to the VDD terminal, and a select transistor 44 having a gate to which a column select signal is input and one electrode serially connected to the source-follower transistor 43 to connect to an output terminal Vout. The CMOS image sensor further includes a photodiode 46 provided between the floating node 42 and a ground terminal, and a charge storage gate 47 formed at one side of the photodiode 46, having a gate to which a charge storage/discharge signal PX is applied. The charge storage gate 47 stores the generated charges in a lower side of the gate when a voltage having a polarity opposite to that of the generated charges is applied while transfers the stored charges to the floating node 45 when a voltage having the same polarity as that of the generated charges or a ground voltage is applied.

A layout and a sectional structure of the aforementioned CMOS image sensor according to the present invention will now be described with reference to FIGS. 5 and 6.

Figure 5:
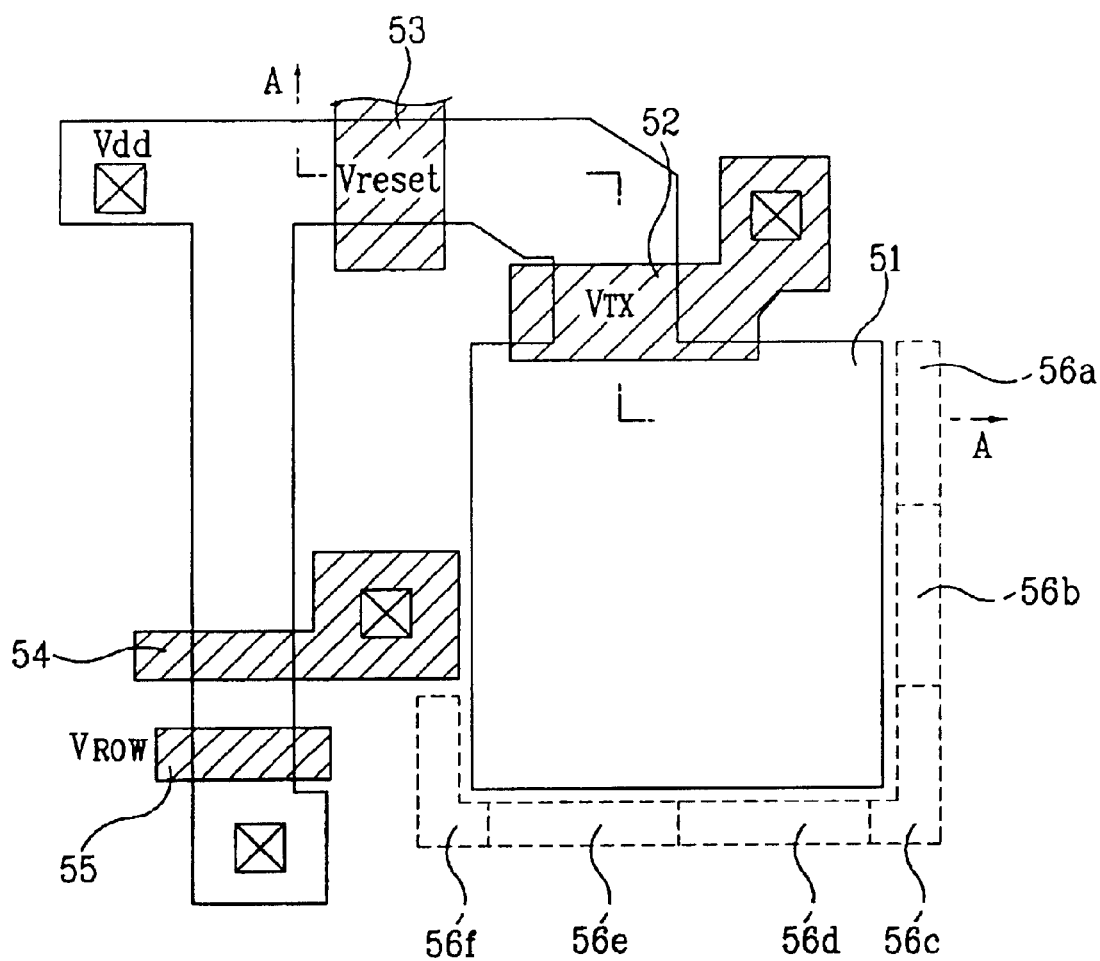
FIG. 5 is a layout of a pixel of a CMOS image sensor according to the present invention.

FIG. 5 is a layout of a pixel of the CMOS image sensor according to the present invention.

Referring to FIG. 5, a transfer gate 52 is formed between one side of a photodiode region 51 and the floating node. A reset gate 53 is formed between the VDD terminal and the floating node. A source-follower gate 54 and a select gate 55 are formed between the output terminal and the VDD terminal.

Charge storage gate forming regions 56a, 56b, 56c, 56d, 56e, and 56f are formed near the photodiode region 51.

Charge storage gates may be formed over either the whole regions or some of the regions. Alternatively, the charge storage gates may be formed on the regions to space apart from one another. The charge storage gates may have various shapes and may be formed in various directions.

In other words, the charge storage gates may be formed anywhere charges generated in the photodiode region can be stored in accordance with design margin of the layout.

The sectional structure of the CMOS image sensor according to the present invention will be described below.

Figure 6:
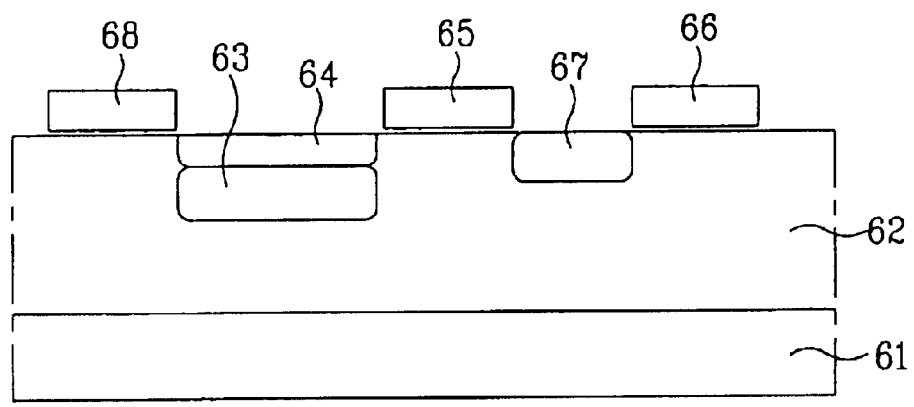
FIG. 6 is a sectional view of a pixel of a CMOS image sensor according to the present invention.

As shown in FIG. 6, a p type epitaxial layer 62 is formed on a p type semiconductor substrate 61. An n type photodiode region 63 and a p type photodiode surface region 64 are formed within a surface of the p type epitaxial layer 62. The p type photodiode surface region 64 is to restrain dark current. Only the n type photodiode region 23 may be formed as the case may be without forming the p type photodiode surface. region 64.

A charge storage gate 68 is formed at one side or near the photodiode regions 63 and 64. The charge storage gate 68 stores charges generated in the photodiode regions 63 and 64.

An n+ type region 67 used as a floating diffusion region for sensing image charges is formed in the p type epitaxial layer 62 and spaced apart from the other side of the photodiode regions 63 and 64.

A transfer gate 65 is formed over the p type epitaxial layer 62 between the photodiode regions 63 and 64 and the n+ type region 67.

A reset gate 66 is formed on the p type epitaxial layer 62 at one side of the n+ type region 67.

The charge sensing operation of the aforementioned CMOS image sensor according to the present invention will be described with reference to FIGS. 7A to 7D.

FIGS. 7A to 7D illustrate the operation of generating and reading out charges of the CMOS image sensor according to the present invention.

Figure 7A:
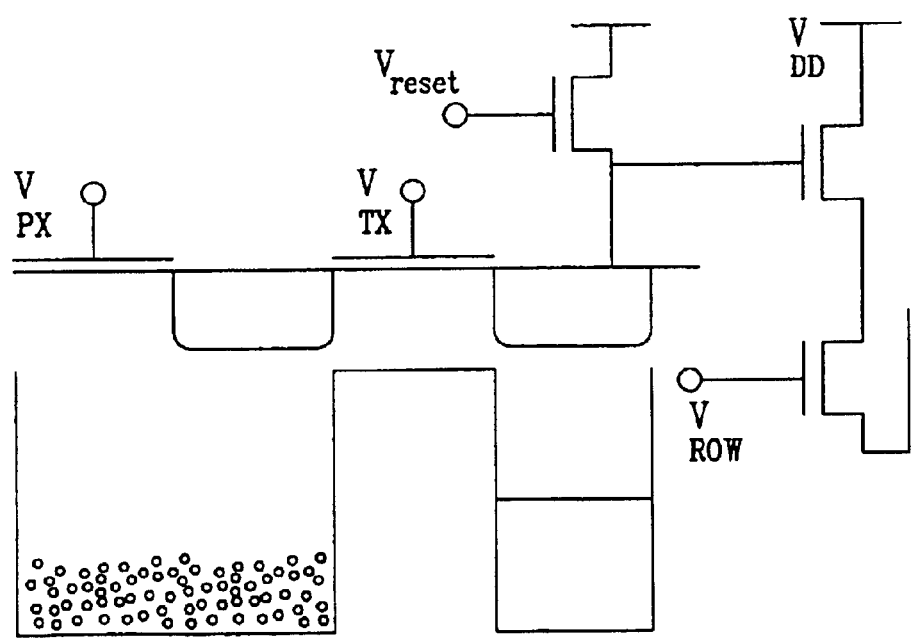
FIGS. 7A to 7D illustrate the operation of generating and reading out charges of a CMOS image sensor according to the present invention.

As shown in FIG. 7A, charges are stored in a photodiode by an external incident light. In this case, a region for storing the charges is not limited to the photodiode. The charges are also stored in a portion below the charge storage gate to which a charge storage/discharge signal $V_{PX}$ is applied.

In other words, the charges stored in the photodiode region are partially or entirely transferred to the portion below the charge storage gate by applying a voltage having a polarity opposite to that of the charges to the charge storage gate when the charges are generated.

The charges stored in the photodiode may be smaller than those stored in the portion below the charge storage gate.

Figure 7B:
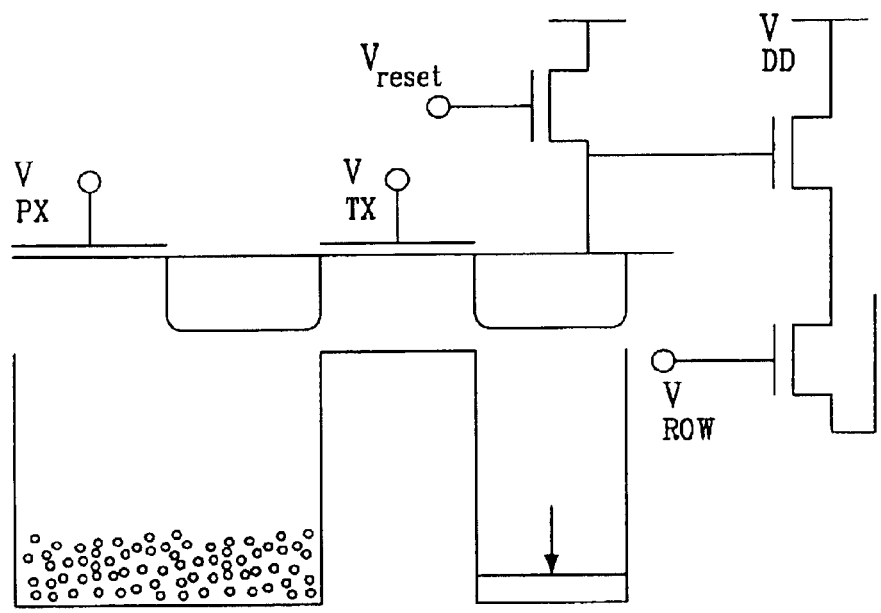
Figure 7C:
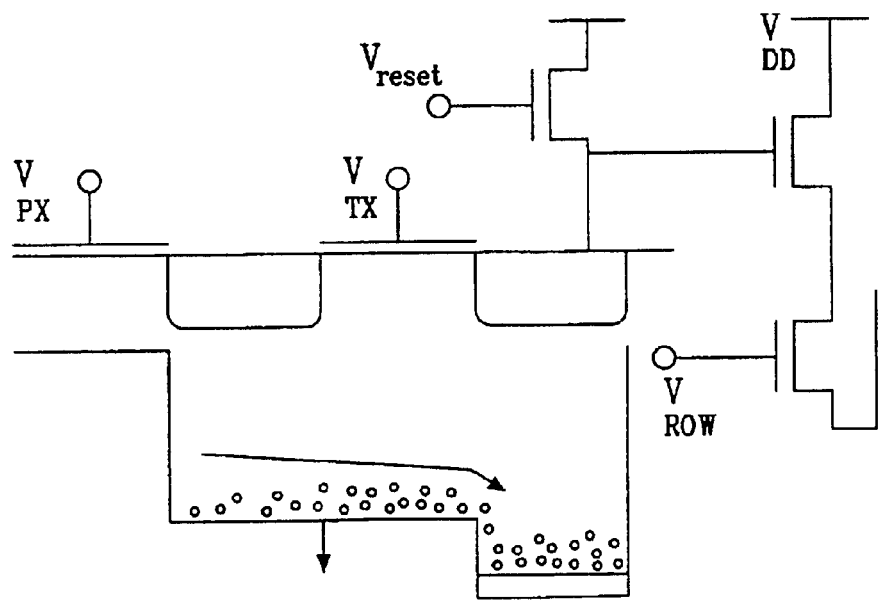

As shown in FIG. 7B, a read out node (floating node) is reset by applying a reset signal Vreset to a reset gate, and then, as shown in FIG. 7C, signal levels of the stored charges are transferred to the floating node if a transfer signal $V_{TX}$ is input to a gate of the transfer transistor to turn on the transfer transistor.

In this case, the charges below the charge storage gate are transferred to the floating node by applying a voltage having the same polarity as that of the charges or a ground voltage to the charge storage gate.

Figure 7D:
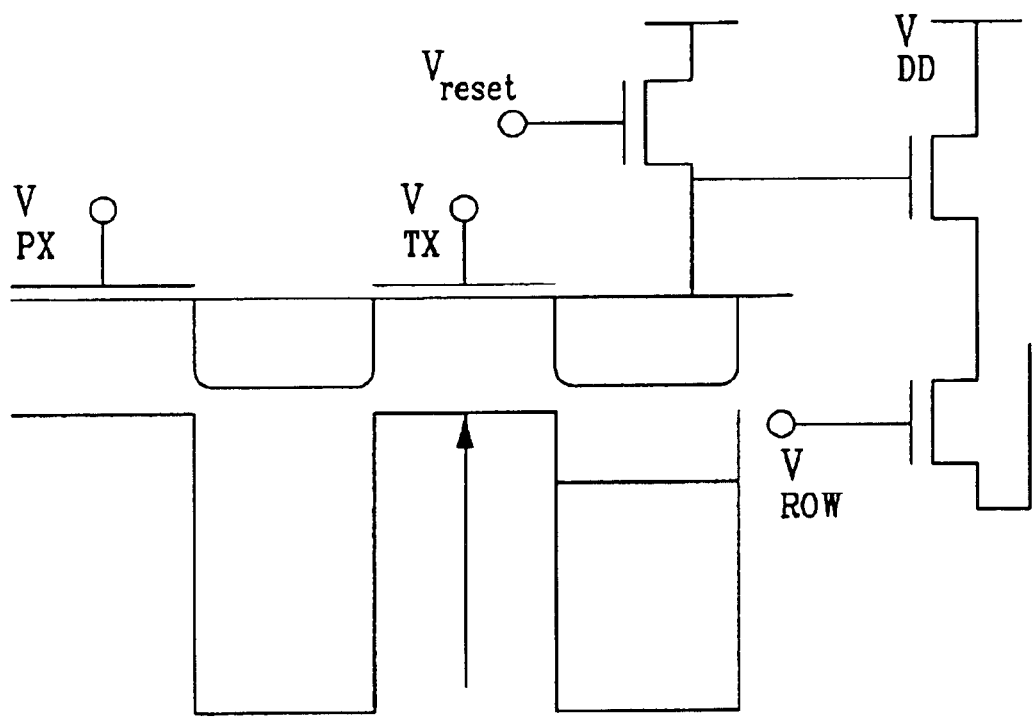

In this state, as shown in FIG. 7D, the reset transistor is turned off and the potential of the floating node, which is a source terminal of the reset transistor, is varied by the signal charges stored in the floating node. For this reason, the gate potential of the source-follower transistor is varied.

The variation of the gate potential of the source-follower transistor varies a bias of a source terminal of the source-follower transistor or drain node of the select transistor.

Once the low select signal $V_{ROW}$ is input to the gate of the select transistor before resetting the read out node (floating node), the select transistor outputs the potential difference between the reference potential of the reset read out node (floating node) and the signal charges generated in the photodiode to the output terminal.

The reset transistor is turned on by the reset signal after detecting signal levels by generating charges of the photodiode. Therefore, the signal charges are all reset.

The above operation is repeated so that the reference potential and the signal levels are read out.

The charge storage gate according to the present invention enhances charge capacity of the photodiode region. Since the charge capacity of the charge storage gate may be greater than the photodiode region, the charge capacity can sufficiently be enhanced even by the gate of a small area.

As aforementioned, the CMOS image sensor according to the present invention has the following advantages.

Since the charge capacity of the photodiode is enhanced for each cell by forming the charge storage gate at one side of the photodiode region without depending on controlling the concentration of impurities, it is possible to reduce the area of the photodiode and thus facilitate enhancement in resolution. In addition, since the optical characteristics of the device can be improved, reliability of the device and competition of the product can be improved.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A CMOS image sensor comprising:
   a photodiode region generating image signal charges by converting image signals of light to electrical signals; and
   a charge storage gate formed at the outer surroundings of the photodiode region, and formed to abut on the photodiode region,
   wherein the charges of the photodiode region are partially or entirely transferred to and stored at a portion below the charge storage gate when the charges are generated so that the space of the charge storage is extended from the photodiode region to the portion below the charge storage gate, and the stored charges, when the charges are read out are transferred to a read out node.

2. The CMOS image sensor of claim 1, wherein a voltage having a polarity opposite to that of the charges is applied to the charge storage gate when the charges are stored.

3. The CMOS image sensor of claim 1, wherein a voltage having the same polarity as that of the charges or a ground voltage is applied to the charge storage gate when the charges are read out.

4. A CMOS image sensor comprising:
   a reset transistor having a gate to which a reset signal RX is applied, one electrode connected to a floating node, and the other electrode connected to a VDD terminal;
   a source-follower transistor having a gate connected to the floating node and one electrode connected to the VDD terminal;
   a select transistor having a gate to which a column select signal is input and one electrode serially connected to the source-follower transistor to connect to an output terminal Vout;

a transfer transistor having one electrode connected to the floating node and a gate to which a transfer signal TX is input so as to transfer storage charges when reading out the storage charges;

a photodiode provided between the transfer transistor and a ground terminal; and a charge storage gate formed at the outer surroundings of the photodiode region, and formed to abut on the photo diode region, the photodiode having a gate to which a charge storage/discharge signal PX is applied, and storing or discharging the generated charges in and to a lower portion of the charge storage gate.

5. The CMOS image sensor of claim 4, wherein the generated charges are stored in a portion below the charge storage gate when a voltage having a polarity opposite to that of the generated charges is applied and the stored charges are transferred to the transfer gate when a voltage having the same polarity as that of the generated charges or a ground voltage is applied.

6. The CMOS image sensor of claim 4, wherein the charges stored in the photodiode are smaller than those stored in the portion below the charge storage gate.

* * * * *